US009064917B2

(12) United States Patent
Ku et al.

(10) Patent No.: US 9,064,917 B2
(45) Date of Patent: Jun. 23, 2015

(54) CONTAINER FOR STORING SEMICONDUCTOR DEVICE

(75) Inventors: Chen-Wei Ku, New Taipei (TW); Sheng-Yuan Wang, New Taipei (TW); Cheng-Ju Lee, New Taipei (TW)

(73) Assignee: Gudeng Precision Industrial Co., Ltd., New Tapei (TW)

( * ) Notice: Subject to any disclaimer, the term of this patent is extended or adjusted under 35 U.S.C. 154(b) by 377 days.

(21) Appl. No.: 13/537,627

(22) Filed: Jun. 29, 2012

(65) Prior Publication Data

US 2013/0248413 A1    Sep. 26, 2013

(30) Foreign Application Priority Data

Mar. 22, 2012    (TW) .............................. 101205228 A

(51) Int. Cl.
*B65D 85/30*    (2006.01)
*H01L 21/673*    (2006.01)

(52) U.S. Cl.
CPC ................................ *H01L 21/67373* (2013.01)

(58) Field of Classification Search
CPC ................... H01L 21/67369; H01L 21/67373; H01L 21/67386
USPC .......... 206/1.5, 454, 710, 711, 722, 723, 832; 220/23.87, 23.89, 323; 355/30, 72, 75, 355/324
See application file for complete search history.

(56) References Cited

U.S. PATENT DOCUMENTS

| 5,711,427 | A | * | 1/1998 | Nyseth .......................... 206/710 |
| 5,957,292 | A | * | 9/1999 | Mikkelsen et al. ........... 206/710 |
| 6,430,877 | B1 | * | 8/2002 | Rosenquist et al. .......... 206/710 |
| 6,457,598 | B1 | * | 10/2002 | Hsieh et al. ................... 206/710 |
| 6,663,148 | B2 | * | 12/2003 | Bonora et al. ................ 206/710 |
| 7,677,393 | B2 | * | 3/2010 | Burns et al. ................... 206/710 |
| 7,909,166 | B2 | * | 3/2011 | Lin ................................ 206/710 |
| 8,083,272 | B1 | * | 12/2011 | Wu et al. ....................... 206/710 |
| 2005/0258069 | A1 | * | 11/2005 | Halbmaier .................... 206/710 |
| 2007/0108095 | A1 | * | 5/2007 | Burns et al. ................... 206/710 |

* cited by examiner

*Primary Examiner* — Luan K Bui
(74) *Attorney, Agent, or Firm* — Rosenberg, Klein & Lee

(57) ABSTRACT

A container for storing semiconductor devices is revealed. The container includes a receiving body, a seal plate, and a cover. At least one fastener and at least one driver are mounted in the receiving body. The seal plate is fastened under the receiving body and against the driver so as to fix the driver on the receiving body. When the driver is rotated, the fastener is driven to move in the receiving body by the driver. At least one fixing part of the fastener is moved toward at least one fastening part of the cover. By the fixing part locked in the fastening part, the cover is fixed on the receiving body. Thus a force opposite to the rotating shaft will not be generated around a periphery of the driver. Therefore stability of the rotating driver is improved and the container is opened and closed smoothly.

20 Claims, 9 Drawing Sheets

CONTAINER FOR STORING SEMICONDUCTOR DEVICE

BACKGROUND OF THE INVENTION

1. Field of the Invention

The present invention relates to a container, especially to a container for storing semiconductor devices.

2. Description of Related Art

Due to countless breakthroughs and fast developments in wafer fabrication techniques, the semiconductor manufacturing processes have produces semiconductor chips whose linear width is smaller than 90 nm. Along with the reduced linear width and the improved integrated density, more semiconductor devices per unit wafer area can be obtained. Yet the semiconductor devices with high integrated density are quite sensitive to contaminants such as particles, dust, organic materials, gas, volatiles, etc. Even a small amount of contaminants leads to defects in the semiconductor devices, or static electricity and a short circuit that damage the semiconductor devices.

In general manufacturing processes of semiconductor devices, a clean room with a low level of air pollutants is provided to protect semiconductor devices from contamination. During transportation of the semiconductor devices, a protective container is required for pollution control.

In order to reduce damages of susceptible semiconductor devices during transportation and storage, lots of techniques that improve container structure and fastening members in the container have been developed for better protection of the semiconductor devices. In an operating system of a standardized mechanical interface, a machine pin is inserted into a driver of a fastening member in the container so as to open and close the container.

However, the driver is directly fastened and fixed in the container. When the driver of the container is driven by the machine pin, a force opposite to a center of the driver is generated around a periphery of the driver and the force leads to instability of the rotation of the driver. This makes the operation of the fastening members unstable. Thus friction occurs between components of the fastening member and other component in the container and contaminants are produced. Therefore semiconductor devices stored in the container are easily to be polluted.

In order to solve the above problems, there is a need to have a novel container for storing semiconductor devices in which the fastening member is not directly fastened and fixed in the container. Thus the driver can be rotated stably and the fastening member can be operated smoothly.

SUMMARY OF THE INVENTION

Therefore it is a primary object of the present invention to provide a container for storing semiconductor devices in which a fastening member is not directly fastened and fixed in the container. Thus the fastening member is operated stably and the container is opened and closed smoothly.

It is another object of the present invention to provide a container for storing semiconductor devices in which possibility of friction between components of a fastening member is eliminated so as to reduce production of contaminants and prevent semiconductor devices in the container from being polluted. Thus high cleanness is ensured in the container.

In order to achieve the above objects, a container for storing semiconductor devices of the present invention includes a cover, a receiving body with at least one insertion hole on a side wall, a driver and a seal plate. The receiving body consists of at least one fastener disposed therein. The fastener is composed of a fastening body, at least one fixing part and a driving part. The fixing part is arranged at one side of the fastening body and corresponding to the insertion hole while the driving part is disposed on the other side of the fastening body. The driver is pivoted in the receiving body and is against the driving part. The seal plate is fastened and fixed under the receiving body and is pressing the driving part against the receiving body. The cover is covered over the receiving body. At least one fastening part is set on a side wall of the cover and the fastening part is corresponding to the insertion hole. When the driver is rotated, the fastener is driven by the driver to move in the receiving body. The fixing part of the fastener is inserted through the insertion hole of the receiving hole to be mounted on the fastening part of the cover so as to fix the cover on the receiving body.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

In conventional containers, a fastening member is directly fastened and fixed in the container. The fastening member may become unstable while being operated and the container is not opened and closed smoothly. Moreover, friction between the fastening member and other components in the container results in contaminants produced in the container and semiconductor devices stored in the container are polluted.

Figure 1:
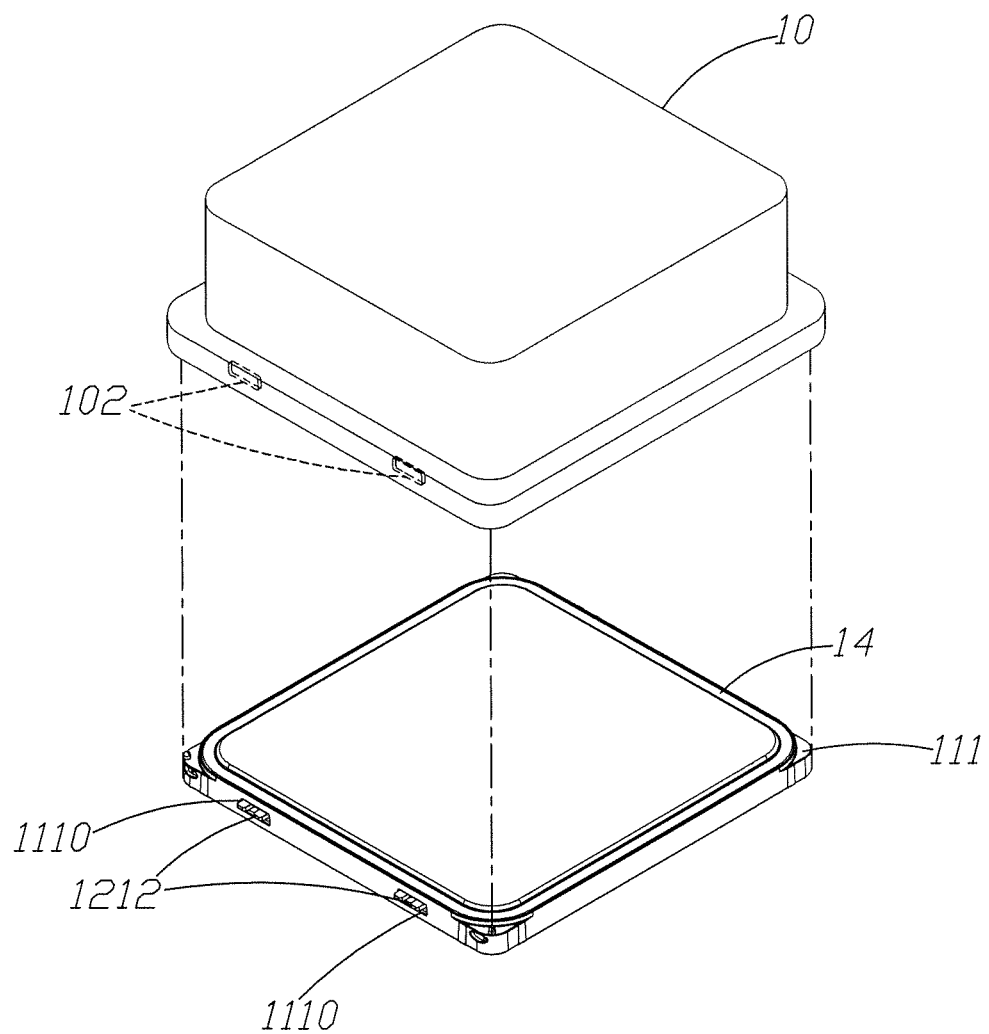
FIG. 1 is an explosive view of a container of an embodiment according to the present invention.
Figure 2:
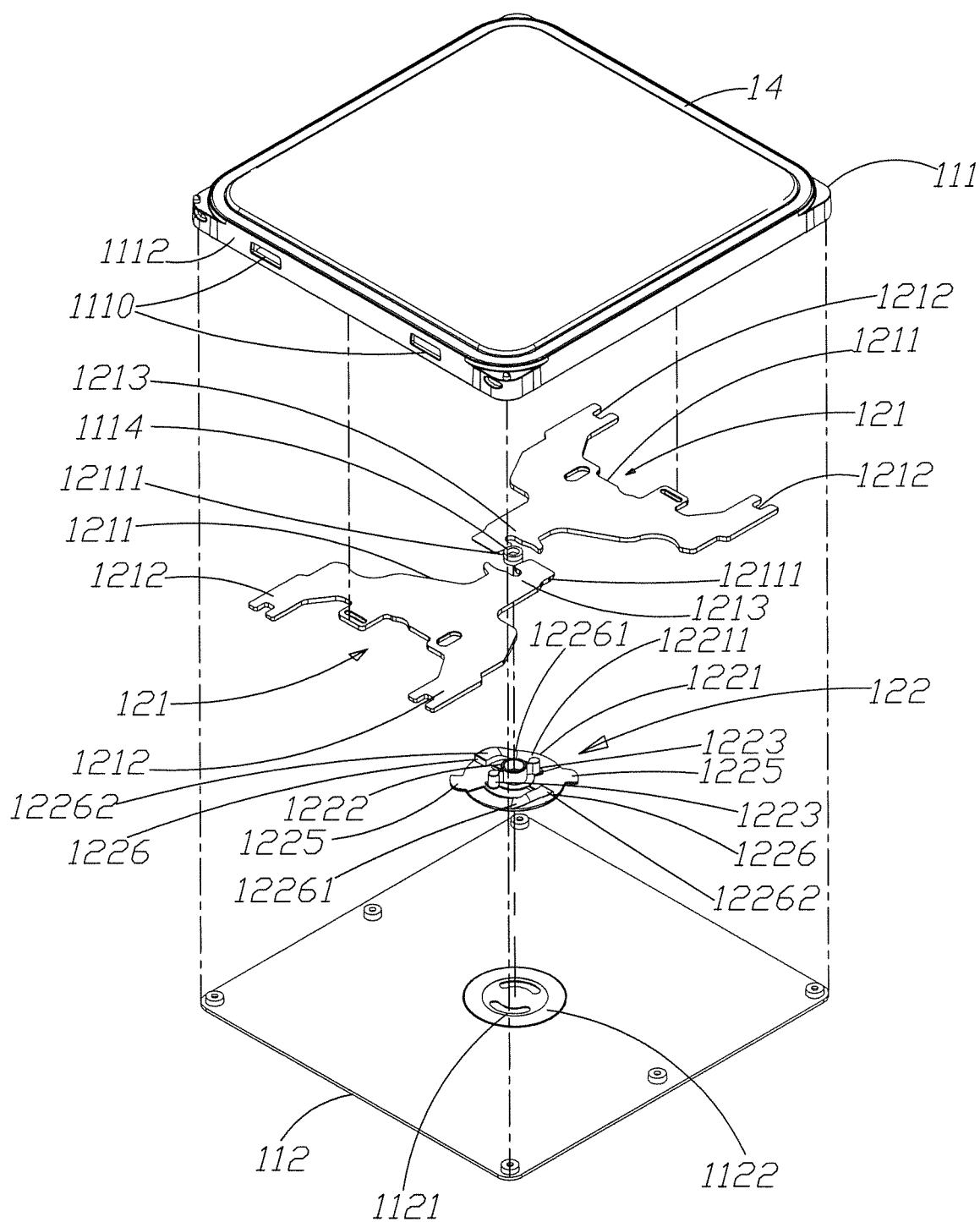
FIG. 2 is a partial explosive view of a container of an embodiment according to the present invention.
Figure 3:
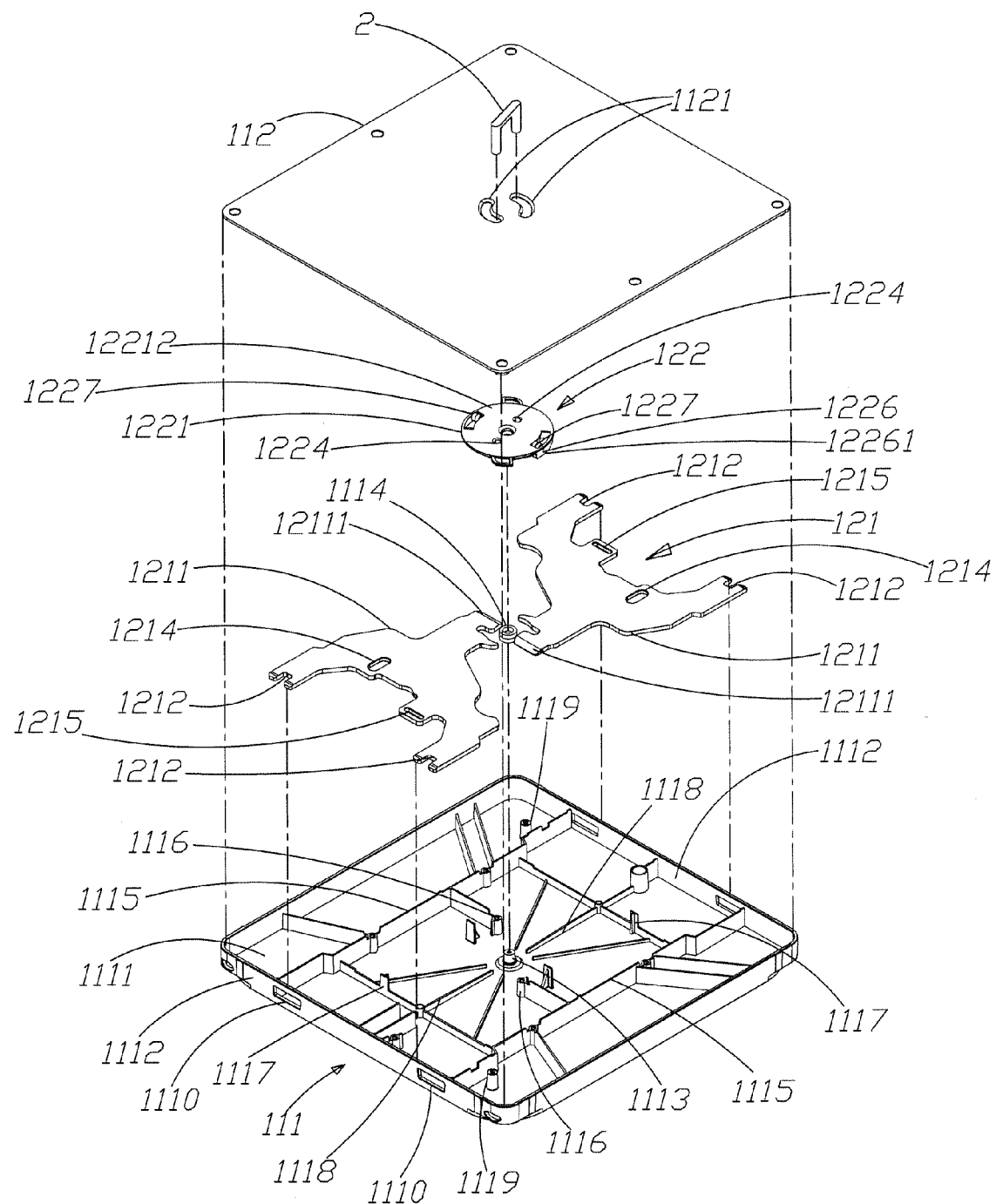
FIG. 3 is another partial explosive view of a container of an embodiment according to the present invention.

Refer to FIG. 1, FIG. 2 and FIG. 3, a container for storing semiconductor devices 1 includes a cover 10, a receiving body 111, and a seal plate 112. At least one semiconductor device is disposed on an outer surface of the receiving body 111 and the cover 10 is arranged over the outer surface of the receiving body 111. A fastening member is mounted in the receiving body 111. The seal plate 112 is against the fastening member so as to fix the fastening member in the receiving body 111. The cover 10 is fixed on the receiving body 111 by the fastening member. Thus the container 1 is completely sealed and is free from external contaminants for keeping the semiconductor device therein (such as photomask, wafer or others) clean. In order to improve air-tightness of the container 1, a seal 14 is disposed between the cover 10 and the receiving body 111 so as to prevent contaminants from entering the container 1 and the container 1 is of higher cleanness.

The receiving body 111 includes an inner surface 1111 and a side wall 1112. The side wall 1112 is arranged around a periphery of the inner surface 1111 so as to form a receiving space. In this embodiment, the fastening member is mounted in the receiving space and having two fasteners 121 and a driver 122. The two fasteners 121 are symmetrically disposed on the inner surface 1111 of the receiving body 111 while each fastener 121 includes a fastening body 1211 and two fixing parts 1212 arranged at one side of the fastening body 1211. The side wall 1112 of the receiving body 111 is disposed with four insertion holes 1110, respectively corresponding to each of the four fixing parts 1212 of the two fasteners 121. Back to FIG. 1, a side wall of the cover 10 is also arranged with four fastening parts 102 respectively corresponding to the four insertion holes 1110 of the receiving body 111. Thus the cover 10 is fixed on the receiving body 111 by the four fixing parts 1212 of the two fasteners 121 respectively passed through the four insertion holes 1110 of the receiving body 111 and mounted on the corresponding fastening parts 102. In this embodiment, the fixing part 1212 is a convex part while the fastening part 102 corresponding to the fixing part 1212 is a slot. The fixing part 1212 and the fastening part 102 can have other structures that fasten to each other.

Figure 4:
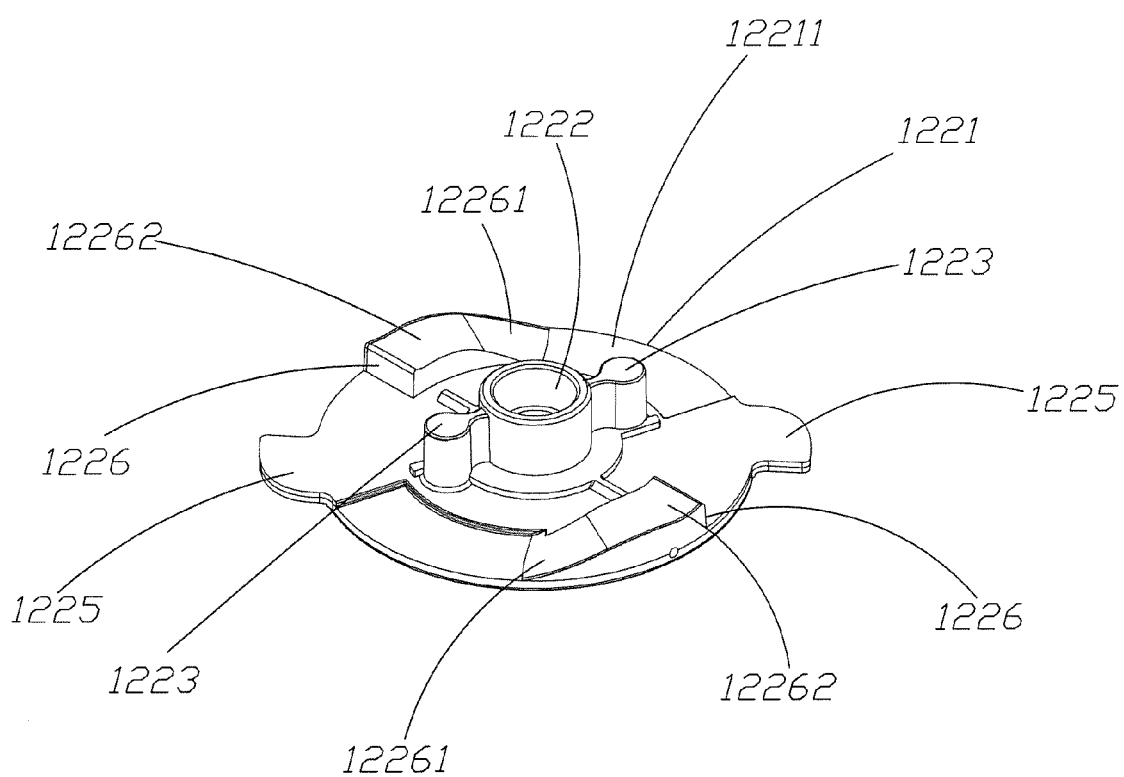
FIG. 4 is a perspective view of a driver of an embodiment according to the present invention.

Also refer to FIG. 4, a perspective view of the driver 122 is revealed. The driver 122 is disposed on the inner surface 1111 of the receiving body 111 and is located between the two fasteners 121. As shown in the FIG. 3, the inner surface 1111 of the receiving body 111 is disposed with a pivot part 1113. The driver 122 includes a driving body 1221 having a first surface 12211 and a second surface 12212. A rotating shaft 1222 is arranged at the first surface 12211 of the receiving body 1221 and is pivotally connected to the pivot part 1113 so that the driver 122 can be rotated in the receiving body 111, as shown in FIG. 2 and FIG. 3. Moreover, the receiving body 111 further includes a bearing 1114 arranged at the pivot part 1113. The rotating shaft 1222 is pivotally connected to the bearing 1114 so as to be pivotally connected to the pivot part 1113. The bearing 114 greatly reduces friction between the pivot part 1113 and the rotating shaft 1222. Thus the driver 122 is allowed to rotate smoothly in the receiving body 111.

Figure 5:
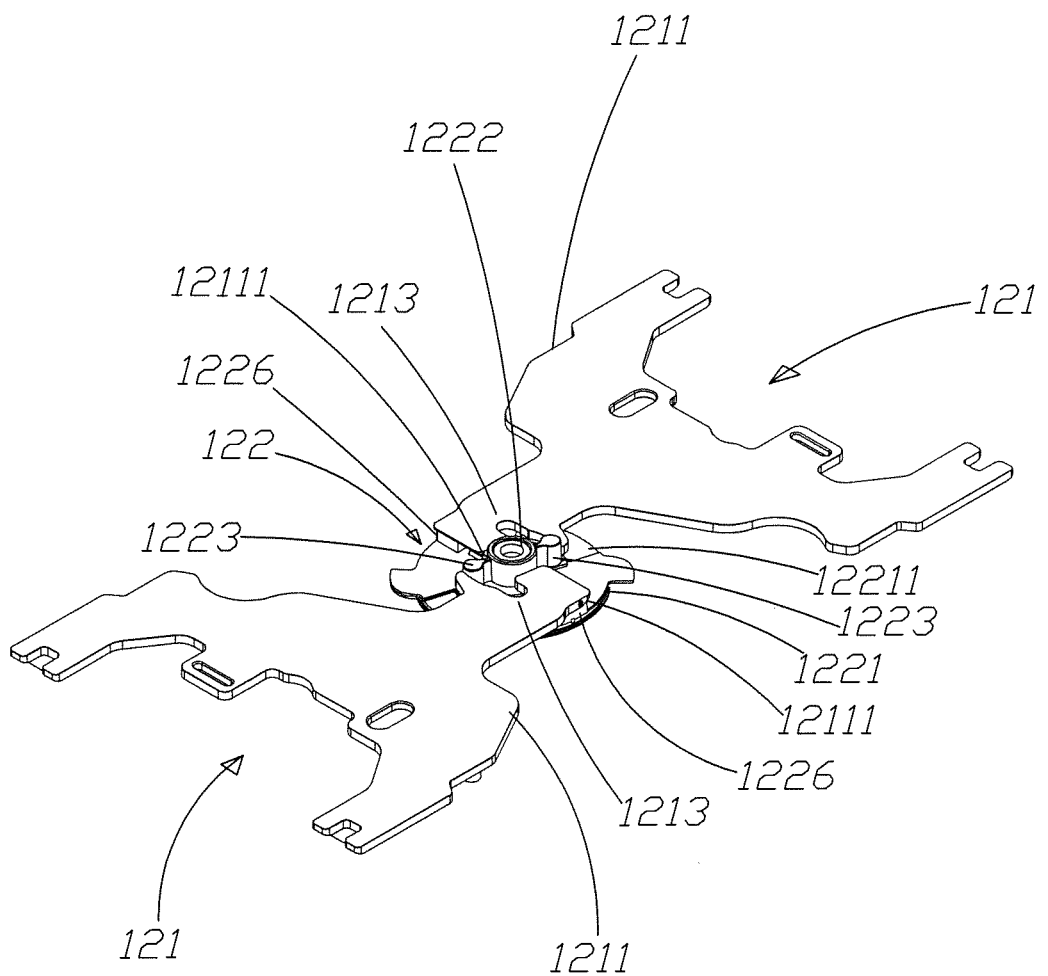
FIG. 5 is a perspective view of a fastener assembled with a driver of an embodiment according to the present invention.

Refer to FIG. 2 and FIG. 5, the driver 122 further includes two guiding members 1223. In this embodiment, each guiding member 1223 is a projecting rod projecting from the first surface 12211 of the driving body 1221 and extending from the rotating shaft 1222 to a periphery of the driving body 1221. A driving part 1213 is disposed on the other side of the fastening body 1211 of each fastener 121, opposite to the fixing parts 1212. The driving parts 1213 of the two fasteners 121 are set between the two guiding members 1223 of the driver 122. The two guiding members 1223 are respectively against the corresponding driving part 1213.

The seal plate 112 is fastened under the receiving body 111 and is against the second surface 12212 of the driving body 1221 of the driver 122 so as to fix the driver 122 between the inner surface 1111 of the receiving body 111 and the seal plate 112 and further fix the fastening member in the receiving body 111. In this embodiment, the rotating shaft 1222 of the driver 122 is not directly fastened on the receiving body 111. Thus a force opposite to the rotating shaft 1222 will not be generated around a periphery of the driver 122. Therefore the driver 122 will not be affected by the force and become unstable while rotating.

Back to FIG. 3, the seal plate 112 includes two insert holes 1121. In this embodiment, each of the two insert holes 1121 is a curved hole while the driving body 1221 of the driver 122 is disposed with two driving holes 1224. The driving hole 1224 penetrates the driving body 1221 to the guiding member 1223, without penetrating the guiding member 1223. Thus the driving hole 1224 is a blind hole. The two insert holes 1121 of the seal plate 112 are corresponding to the two driving holes 1224 of the driver 122. While users intend to rotate the driver 122, a pin 2 is inserted through the insert holes 1121, inserted into the driving holes 1224 and moved within the insert holes 1121 so as drive the driver 122 to rotate.

While the driver 122 being rotated, the two guiding members 1223 of the driver 122 push the two driving parts 1213 of the two fasteners 121 and the two fasteners 121 move horizontally within the receiving body 111. When the driver 122 is rotated counterclockwise, the two guiding members 1223 push the two driving parts 1213 of the two fasteners 121 and the two fasteners 121 respectively move toward two sides of the receiving body 111, allowing the fixing parts 1212 of each fastener 121 moving toward and locked in the fastening parts 102 of the cover 10. Thus the receiving body 111 and the cover 10 are fastened with each other. When the driver 122 is rotated clockwise, the two guiding members 1223 push the two driving parts 1213 of the two fasteners 121 to move toward the center of the receiving body 111. Thus the fixing parts 1212 of each fastener 121 are released from the fastening parts 102 of the cover 10. The receiving body 111 and the cover 10 are separated from each other.

Figure 6:
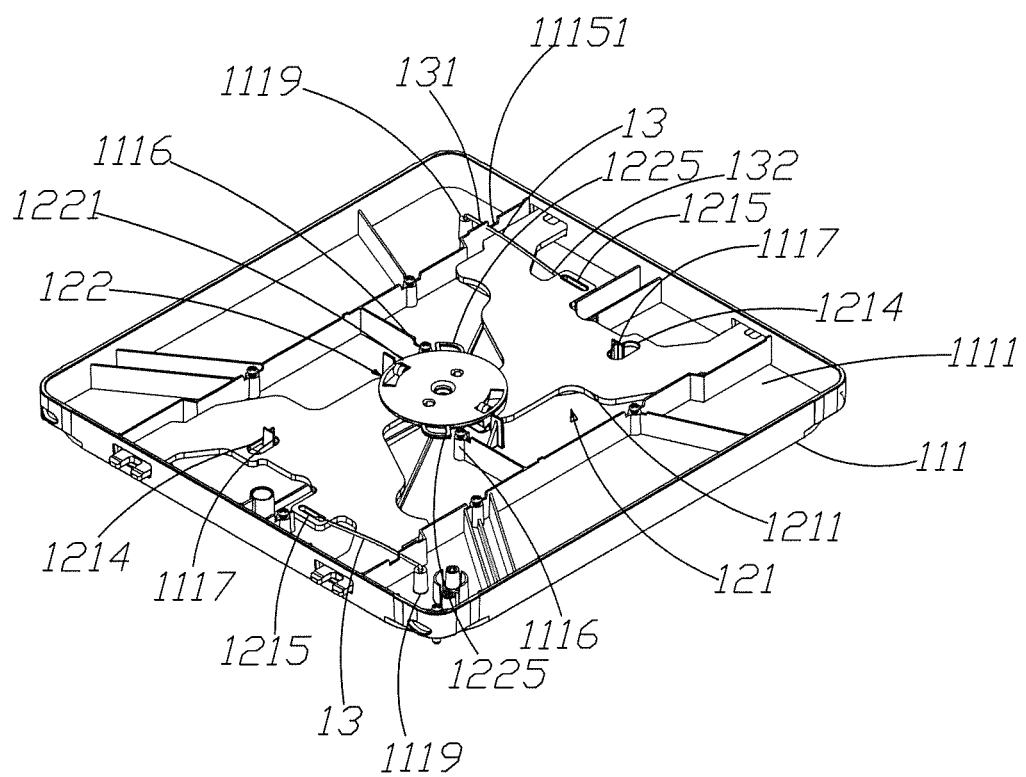
FIG. 6 is a perspective view of a receiving body of an embodiment according to the present invention.

Still refer to FIG. 3, in order to make the fastener 121 move linearly, the receiving body 111 is further disposed with two first stopping parts 1115, respectively located on two sides of the two fasteners 121. Thus the two fasteners 121 move horizontally between the two first stopping parts 1115. That means the stopping parts 1115 are parallel to the movement direction of the fasteners 121. Furthermore, the receiving body 111 is further arranged with two second stopping parts 1116, located on two sides of the driver 122. A periphery of the driving body 1221 of the driver 122 is also disposed with two stopping members 1225, respectively located between the two second stopping parts 1116. Refer to FIG. 6, when the driver 122 is rotated, the two stopping members 1225 of the driver 122 are respectively moved between the two second stopping parts 1116 so as to limit the rotation angle of the driver 122. Moreover, the inner surface 1111 of the receiving body 111 is further set with two third stopping parts 1117 while the fastening body 1211 of each fastener 121 is disposed with a positioning hole 1214. The two third stopping parts 1117 are respectively mounted into the corresponding positioning hole 1214 of each fastener 121 so as to limit the position of the two fasteners 121 inside the receiving body 111.

There is a plurality of supporting parts 1118 disposed on the receiving body 111. The supporting parts 1118 are arranged between the two first stopping parts 1115 and under the two fasteners 121. The supporting parts 1118 are used for supporting the two fasteners 121, keeping the two fasteners 121 away from the inner surface 1111 of the receiving body 111, and reducing contact area between the two fasteners 121 and the inner surface 1111 of the receiving body 111. Thus the friction force between the two fasteners 121 and the inner surface 1111 of the receiving body 111 during the movement of the fasteners 121 is reduced. Therefore the two fasteners 121 move smoothly on the inner surface 1111 of the receiving body 111.

Back to FIG. 2, FIG. 3, FIG. 4, and FIG. 5, the driver 122 of this embodiment further includes two pressing parts 1226 respectively located between the two guiding members 1223. The pressing part 1226 is a projecting block that projects from the first surface 12211 of the driving body 1221. Each pressing part 1226 consists of a guiding surface 12261 and a positioning slot 12262. When the driver 122 is rotated counterclockwise, one side of each fastener 121 with the driving part 1213 is against the guiding surface 12261 of the corresponding pressing part 1226. Along with the rotation of the driver 122, the guiding surface 12261 originally against the surface of the driving part 1213 is moved along the surface of the driving part 1213 so that the one side of the fastener 121 with the driving part 1213 is descended along the guiding surface 12261 while one side of the fastener 121 with the fixing parts 1212 is ascended. Thus the fixing parts 1212 are locked with the fastening parts 102 and the container 1 is having good air-tightness. Each fastener 121 includes a ramp 12111 at one side of the driving part 1213 that is pressing against the pressing part 1226. As shown in FIG. 5, the pressing part 1226 is moved from the ramp 12111 of the fastening body 1211 to the surface of the driving part 1213 and then moved along the surface of the driving part 1213.

The driving body 1221 of the driver 122 is further mounted with two rolling parts 1227 respectively under the corresponding pressing part 1226. While the driver 122 being rotated, the two rolling parts 1227 allow the driver 122 not in direct contact with the seal plate 112. That means friction between the driver 122 and the seal plate 112 is reduced by reduction of contact area between the driver 122 and the seal plate 112. Moreover, the rolling parts 1227 are rolled along with rotation of the driver 122 so that the driver 122 is rotated stably. Thus the chance of producing contaminants by the friction between the driver 122 and the seal plate 112 is minimized and protect the semiconductor devices susceptible to the contaminants. In this embodiment, the rolling part 1227 is a bearing. The rolling part 1227 can be other component. In this embodiment, the rolling part 1227 is a bearing. The rolling part 1227 can be other components.

Although the two rolling parts 1227 allows the driver 122 rotating stably, there is still friction between them and the seal plate 112. Thus contaminants are produced in the container 1 and the semiconductor devices stored in the container 1 still have contamination problems. In this embodiment, a wear-resistant part 1122 for reducing friction is adhered to the seal plate 112. The wear-resistant part 1122 is located between the seal plate 112 and the two rolling parts 1227 where friction occurs so as to reduce abrasion of the seal plate 112 caused by the two rolling parts 1227. Furthermore, the amount of contaminants produced is minimized and the contamination of semiconductor devices stored in the container 1 can be avoided.

Back to FIG. 6, the receiving body 111 is arranged with two connecting parts 1119, respectively located on one side of the corresponding fastener 121. The fastening body 1211 of each fastener 121 is also disposed with a connecting member 1215. Each connecting part 1119 is connected to the corresponding connecting member 1215 of the fastener 121 by an elastic part 13. Each of the two first stopping parts 1115 of the receiving body 111 includes a slit 11151 that allows the corresponding elastic part 13 to pass through. The length of the elastic part 13 is shorter than the thickness of the receiving body 111 so that the receiving body 111 can be sealed tightly by the seal plate 112 of the container 1. The position of each fastener 121 while being fastened with the fastening parts 102 of the cover 10 is defined as the original position of the fastener 121. When the two fasteners 121 are moved toward the center of the receiving body 111, the elastic part 13 is also moved toward the center of the receiving body 111 along with the fastener 121 and then to be stopped by one side of the slit 11151. A restoring force is generated by the elastic part 13 due to material elasticity when the elastic part 13 is in contact with the side of the slit 11151 and stopped by the slit 11151. The restoring force makes the fastener 121 turn back to the original position. Thus the elastic parts 13 get the fasteners 121 turning back to the original positions when the driver 122 doesn't work well. And the fasteners 121 are fastened to the fastening parts 102 of the cover 10 to prevent the receiving body 111 from separating from the cover 10.

Figure 7:
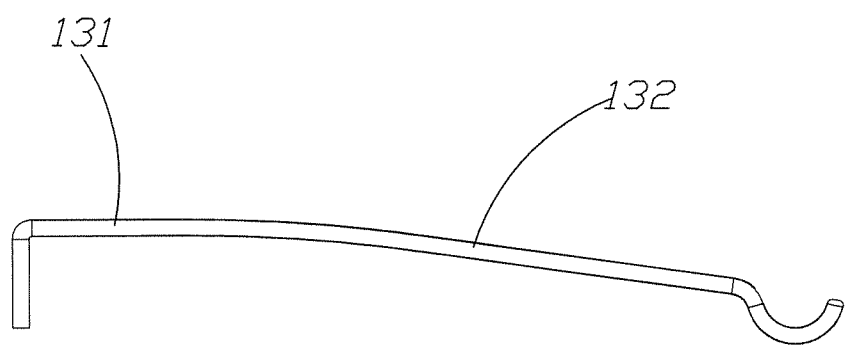
FIG. 7 is a schematic drawing of an elastic element of an embodiment according to the present invention.

Refer to FIG. 7, the elastic part 13 is composed of a first part 131 and a second part 132 connected to the first part 131. One end of the first part 131 is disposed on the connecting part 1119 of the receiving body 111 while one end of the second part 132 is arranged at the connecting member 1215 of the fastener 121. The second part 132 of the elastic part 13 inclined downward with respect to the first part 131 is pressing against the fastening body 1211 of each fastener 121.

When the driving part 1213 of the fastener 121 is pressed by the pressing parts 1226 of the driver 122, the fixing part 1212 of the fastener 121 is lifted and fastened to the fastening parts 102 of the cover 10 while second part 132 of the elastic part 13 inclined downward with respect to the first part 131 of the elastic part 13 is pressing against the fastening body 1211 of each fastener 121 so that the fixing part 1212 of the fastener 121 is maintained at the ascended state and is locked to the fastening parts 102 of the cover 10. The container 1 is with good air-tightness.

Figure 8:
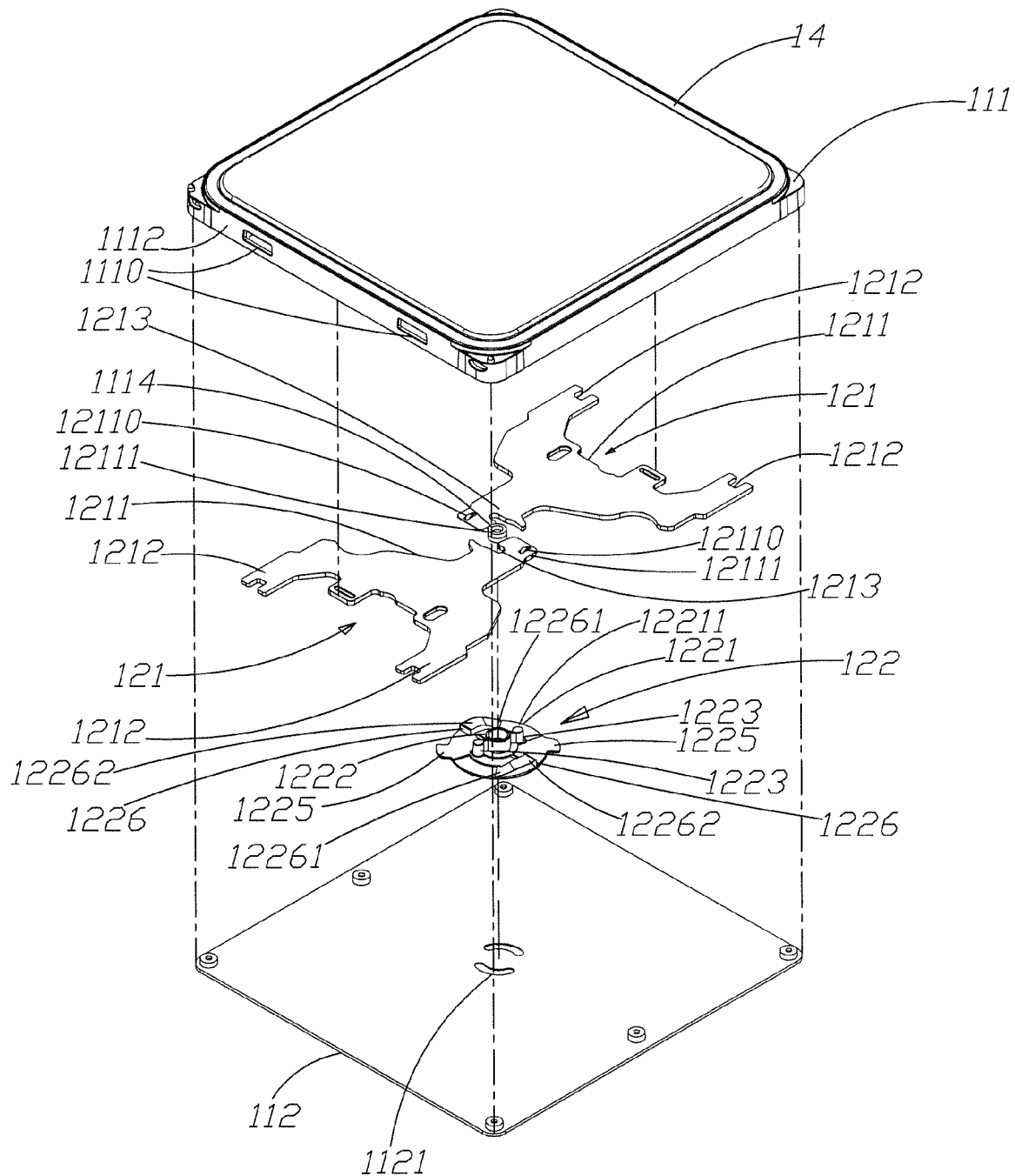
FIG. 8 is a partial explosive view of a container of another embodiment according to the present invention.
Figure 9:
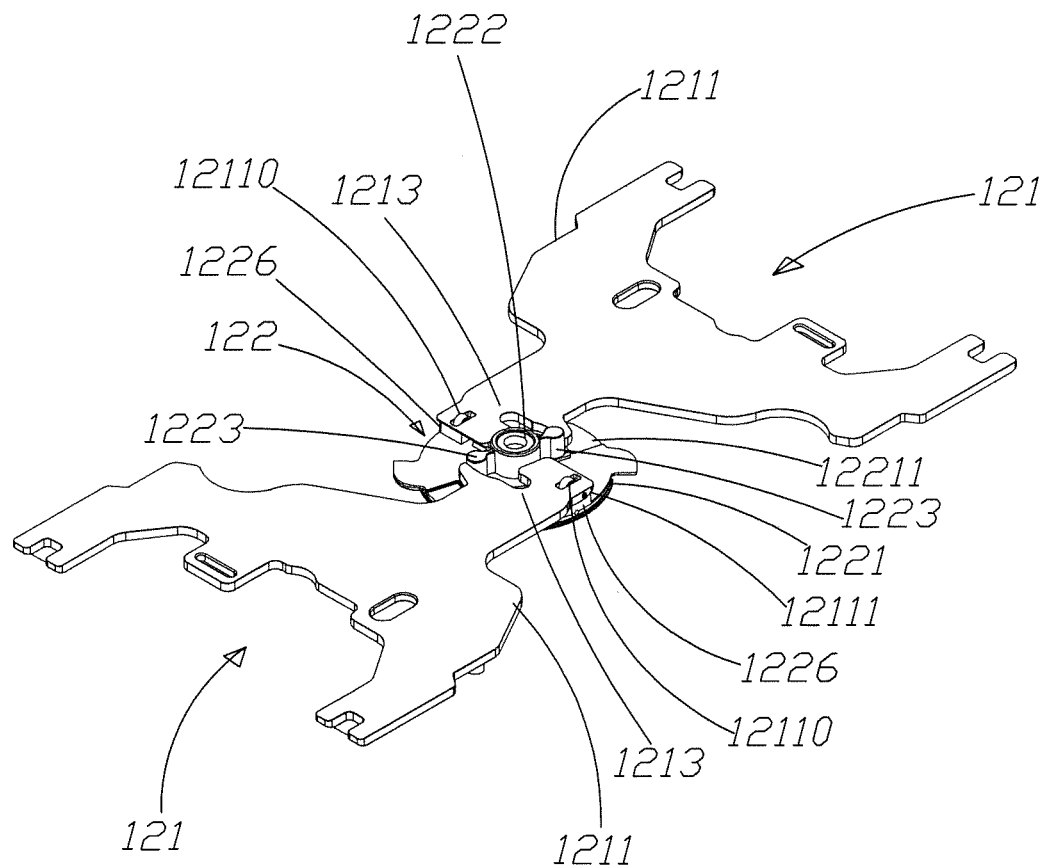
FIG. 9 is a perspective view of a fastener assembled with a driver of another embodiment according to the present invention.

Refer to FIG. 8 and FIG. 9, another embodiment of the present invention is revealed. When the driver 122 is rotated, the driver 122 is in contact with a part of the surface of each driving part 1213 of the fastener 121 and friction occurs between the pressing parts 1226 of the driver 122 and the driving parts 1213. In order to reduce the friction between the driver 122 and the driving part 1213, a rolling element 12110 is mounted on the driving part 1213 of the fastener 121 where the friction occurs. Thus the guiding surface 12261 of each pressing part 1226 of the driver 122 is in contact with the rolling element 12110 on the driving part 1213 of the fastener 121 and the contact area between the driving part 1213 and the corresponding pressing part 1226 is reduced. Therefore friction between the driving parts 1213 and the pressing parts 1226 is minimized to suppress production of contaminants and prevent the semiconductor devices in the container 1 from being polluted.

The guiding surface 12261 of the pressing part 1226 of the driver 122 is in contact with the rolling element 12110 on the driving part 1213 of the fastener 121. Thus the driver 122 drives the rolling element 12110 to roll when the driver 122 is rotated. The rolling element 12110 is rolled and moved along the guiding surface 12261. The positioning slot 12262 is disposed on a rear end of the guiding surface 12261. While the rolling element 12110 being rolled along the guiding surface 12261 and moved to the positioning slot 12262, the rolling element 12110 is stopped and positioned by the positioning slot 12262. Thus the fixing part 1212 of the fastener 121 is fastened to the fastening part 102 of the cover 10. By rolling of the rolling element 12110 along the guiding surface 12261, the friction between the rolling element 12110 and the guiding surface 12261 is reduced. Thus the driver 122 drives the fasteners 121 to move within the receiving body 111 smoothly. By smooth operation of the fastening member, the container 1 is opened and closed smoothly. In this embodiment, the rolling element 12110 is a bearing. The rolling element 12110 can also be other component. The rolling element 12110 can also be applied to other structure where the driver 122 is fastened to the receiving body 111.

In summary, the present invention provides a container for storing semiconductor devices. The container includes a cover fixed on a receiving body by a fastening member disposed in the receiving body to seal the container and prevent the container from being polluted by external contaminants. The fastening member consists of at least one fastener used together with a driver. The fastener and the driver are arranged at the receiving body. Instead of being fastened by screws, the driver is fixed in the receiving body by a seal plate against the driver. Thus the driver is rotated stably. The driver is disposed with two rolling parts for reducing contact area between the driver and the seal plate and preventing production of contaminants by friction between the driver and the seal plate so that semiconductor devices are protected from contamination. Moreover, a wear-resistant part is disposed on the seal plate where the seal plate is in contact with the rolling parts. Thus the amount of contaminants produced by the friction between the rolling parts and the seal plate is decreased and the probability of contamination is reduced.

Furthermore, each fastener of the fastening member is disposed with a rolling element that is in contact with the driver so as to reduce contact area between the driver and the fastener and prevent friction between the driver and the fastener that produces contaminants in the container. Thus the semiconductor devices will not be contaminated. The rolling element is rolled along with rotation of the driver to reduce the friction therebetween. Thus the driver drives the fastener to move in the receiving body smoothly and the fastening member works well. Therefore, the container is opened and closed smoothly.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

What is claimed is:

1. A container for storing semiconductor devices comprising:
   a receiving body with at least one insertion hole on a side wall thereof and having:
   at least one fastener disposed in the receiving body while the fastener having a fastening body, at least one fixing part corresponding to the insertion hole and arranged at one side of the fastening body, and a driving part set on the other side of the fastening body; and
   a driver pivotally connected to the receiving body and against the driving part;
   a seal plate fixed under the receiving body and pressing the driver against the receiving body;
   a cover set over the receiving body and having at least one fastening part on a side wall thereof while the fastening part is corresponding to the insertion hole; and
   a wear-resistant part disposed on the seal plate and corresponding to the driver;
   wherein the driver drives the fastener to move in the receiving body and the fixing part of the fastener is inserted through the insertion hole of the receiving body to be mounted on the fastening part so as to fix the cover on the receiving body when the driver is rotated.

2. The device as claimed in claim 1, wherein the container for storing semiconductor devices further includes a seal arranged between the cover and the receiving body.

3. The device as claimed in claim 1, wherein the receiving body further includes at least one supporting part disposed therein and located under the fastener to support the fastener.

4. The device as claimed in claim 1, wherein the receiving body further includes two first stopping parts disposed in the receiving body; the first stopping parts are arranged at two sides of the fastener respectively and are parallel to movement direction of the fastener.

5. The device as claimed in claim 4, wherein the receiving body further includes two second stopping parts disposed in the receiving body and two stopping members arranged at the driver; the second stopping parts are respectively set between the two stopping members of the driver; the stopping members of the driver are respectively moveable between the two second stopping parts.

6. The device as claimed in claim 5, wherein the receiving body further includes at least one third stopping part disposed in the receiving body and mounted into a positioning hole of the fastening body.

7. The device as claimed in claim 1, wherein the container for storing semiconductor devices further includes an elastic part; one end of the elastic part is connected to a connecting part of the receiving body and the other end thereof is connected to a connecting member of the fastener.

8. The device as claimed in claim 7, wherein the elastic part includes a first part and a second part; one end of the first part is connected to the connecting part of the receiving body while one end of the second part is connected to the connecting member of the fastener; the second part is inclined with respect to the first part.

9. The device as claimed in claim 1, wherein the driver includes a driving body having a first surface and a second surface corresponding to the first surface; the first surface is in contact with the fastener while the second surface is in contact with the seal plate; and a rotating shaft that is arranged at the first surface of the driving body and is pivotally connected to a pivot part of the receiving body.

10. The device as claimed in claim 9, wherein the driver further includes at least one rolling part mounted on the driving body and in contact with the seal plate.

11. The device as claimed in claim 10, wherein the rolling part is a bearing.

12. The device as claimed in claim 9, wherein the receiving body further includes a bearing disposed on the pivot part and the rotating shaft is pivotally connected to the bearing.

13. The device as claimed in claim 9, wherein the driver further includes at least one guiding member projecting from the first surface of the driving body, extending from the rotating shaft to a periphery of the driving body and against the driving part of the fastener.

14. The device as claimed in claim 9, wherein the seal plate includes at least one insert hole that is corresponding to at least one driving hole of the driver and is allowing at least one pin to insert through; the pin is inserted through the insert hole, inserted into the driving hole and moveable within the insert hole so as to rotate the driver.

15. The device as claimed in claim 9, wherein the driver further includes at least one pressing part that projects from the first surface of the driving body for pressing a surface of the driving part.

16. The device as claimed in claim 15, wherein a surface of the pressing part corresponding to the driving part is a guiding surface; one side of the fastener with the driving part is ascended and descended along with the guiding surface.

17. The device as claimed in claim 16, wherein the container for storing semiconductor devices further includes at least two rolling element disposed on the driving part of the fastener and are against and in contact with the guiding surface of the pressing part correspondingly.

18. The device as claimed in claim 17, wherein a positioning slot is disposed on a rear end of the guiding surface and the rolling element is received in the positioning slot.

19. The device as claimed in claim 17, wherein the rolling element is a bearing.

20. The device as claimed in claim 16, wherein one side of the driving part is a ramp; the ramp is in contact with the guiding surface of the pressing part.

* * * * *